United States Patent
Kwon et al.

(10) Patent No.: US 11,967,538 B2
(45) Date of Patent: Apr. 23, 2024

(54) THREE DIMENSIONAL IC PACKAGE WITH THERMAL ENHANCEMENT

(71) Applicant: Google LLC, Mountain View, CA (US)

(72) Inventors: Woon-Seong Kwon, Santa Clara, CA (US); Xiaojin Wei, Dublin, CA (US); Madhusudan K. Iyengar, Foster City, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/226,177

(22) Filed: Apr. 9, 2021

(65) Prior Publication Data
US 2022/0328376 A1  Oct. 13, 2022

(51) Int. Cl.
| H01L 23/367 | (2006.01) |
| H01L 21/48 | (2006.01) |
| H01L 23/00 | (2006.01) |
| H01L 23/498 | (2006.01) |
| H01L 23/538 | (2006.01) |
| H01L 25/18 | (2023.01) |

(52) U.S. Cl.
CPC ...... *H01L 23/3675* (2013.01); *H01L 21/4882* (2013.01); *H01L 23/49816* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 25/18* (2013.01); *H01L 2224/16227* (2013.01); *H01L 2224/16235* (2013.01); *H01L 2924/1433* (2013.01); *H01L 2924/1434* (2013.01)

(58) Field of Classification Search
None
See application file for complete search history.

(56) References Cited

U.S. PATENT DOCUMENTS

| 7,459,782 B1 | 12/2008 | Li |
| 7,724,527 B2 | 5/2010 | Coico et al. |
| 7,781,883 B2 | 8/2010 | Sri-Jayantha et al. |
| 8,299,608 B2 | 10/2012 | Bartley et al. |
| 8,526,186 B2 | 9/2013 | Yokoya et al. |
| 9,070,656 B2 | 6/2015 | Hooper et al. |
| 9,735,043 B2 | 8/2017 | Ho et al. |
| 10,553,522 B1 | 2/2020 | Canaperi et al. |
| 2011/0042784 A1 | 2/2011 | Edwards et al. |
| 2012/0006383 A1 | 1/2012 | Donnelly |
| 2014/0252579 A1 | 9/2014 | Chang et al. |

(Continued)

FOREIGN PATENT DOCUMENTS

TW  202029426 A  8/2020

OTHER PUBLICATIONS

Extended European Search Report for Euorpean Patent Application No. 22154734.2 dated Aug. 1, 2022. 9 pages.

*Primary Examiner* — Hung K Vu
(74) *Attorney, Agent, or Firm* — Lerner David LLP

(57) ABSTRACT

An IC die includes a temperature control element suitable for three-dimensional IC package with enhanced thermal control and management. The temperature control element may be formed as an integral part of an IC die that may assist temperature control of the IC die when in operation. The temperature control element may include a heat dissipation material disposed therein to assist dissipating thermal energy generated by the plurality of devices in the IC die during operation.

17 Claims, 11 Drawing Sheets

(56) References Cited

U.S. PATENT DOCUMENTS

| | | | | |
|---|---|---|---|---|
| 2015/0187675 | A1* | 7/2015 | Tang | H01L 23/36 |
| | | | | 438/584 |
| 2017/0358556 | A1* | 12/2017 | Bitz | H01L 23/46 |
| 2019/0074237 | A1 | 3/2019 | Beauchemin et al. | |
| 2019/0348401 | A1* | 11/2019 | Vadhavkar | H01L 21/78 |
| 2020/0105635 | A1 | 4/2020 | Yu et al. | |

* cited by examiner

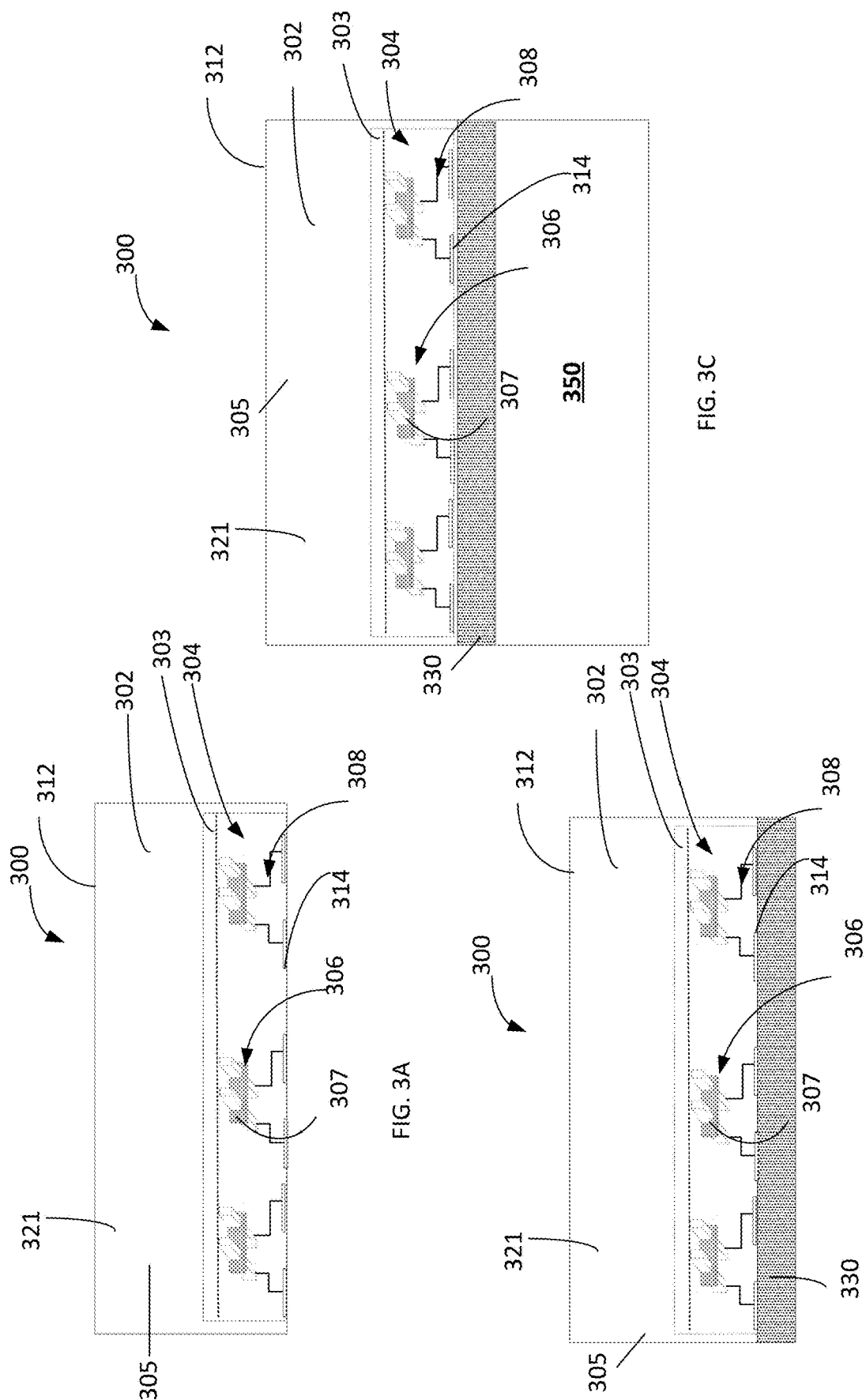

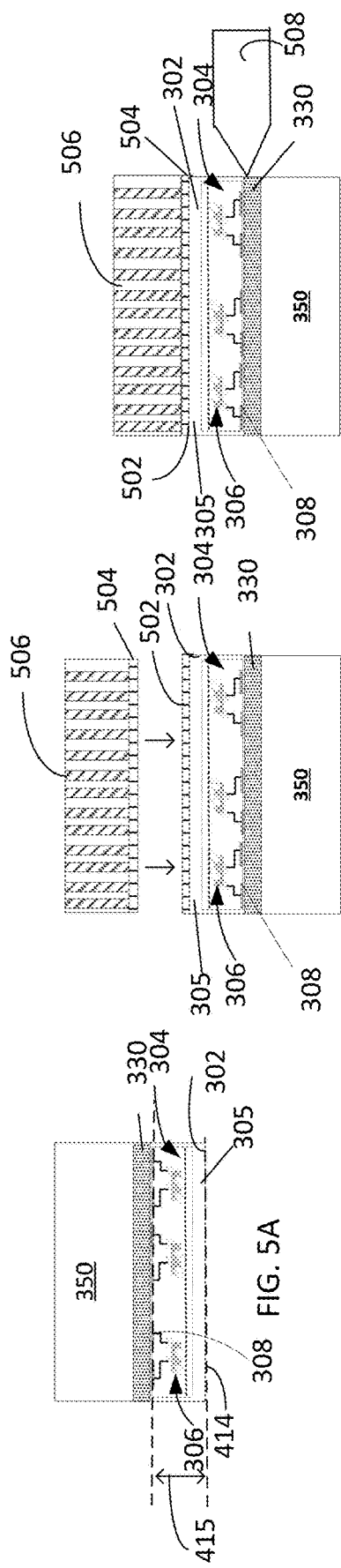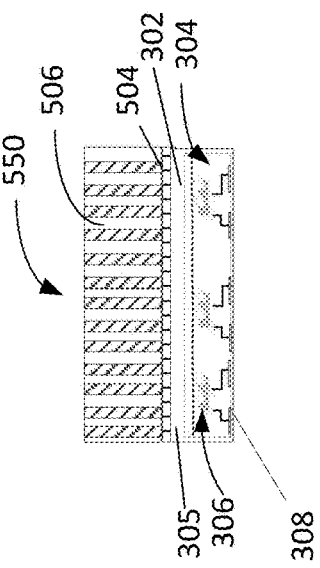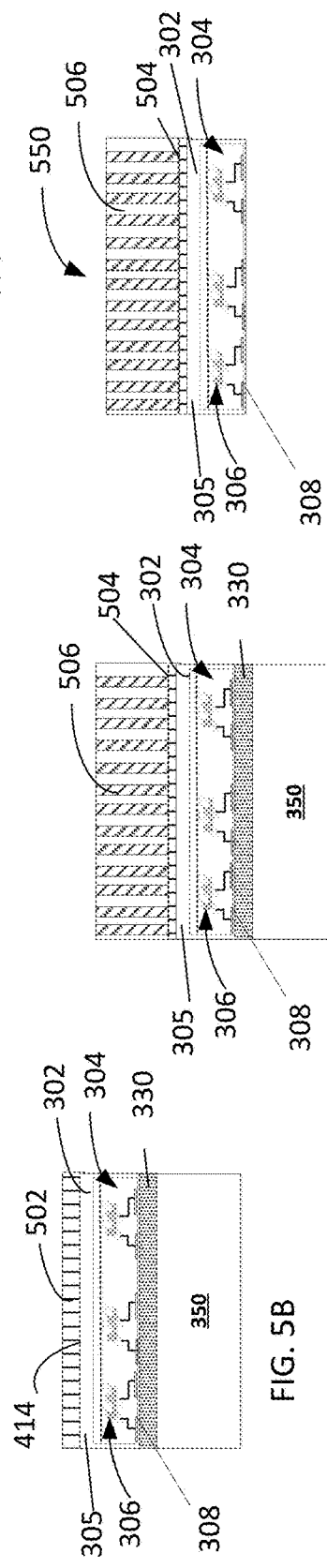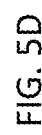

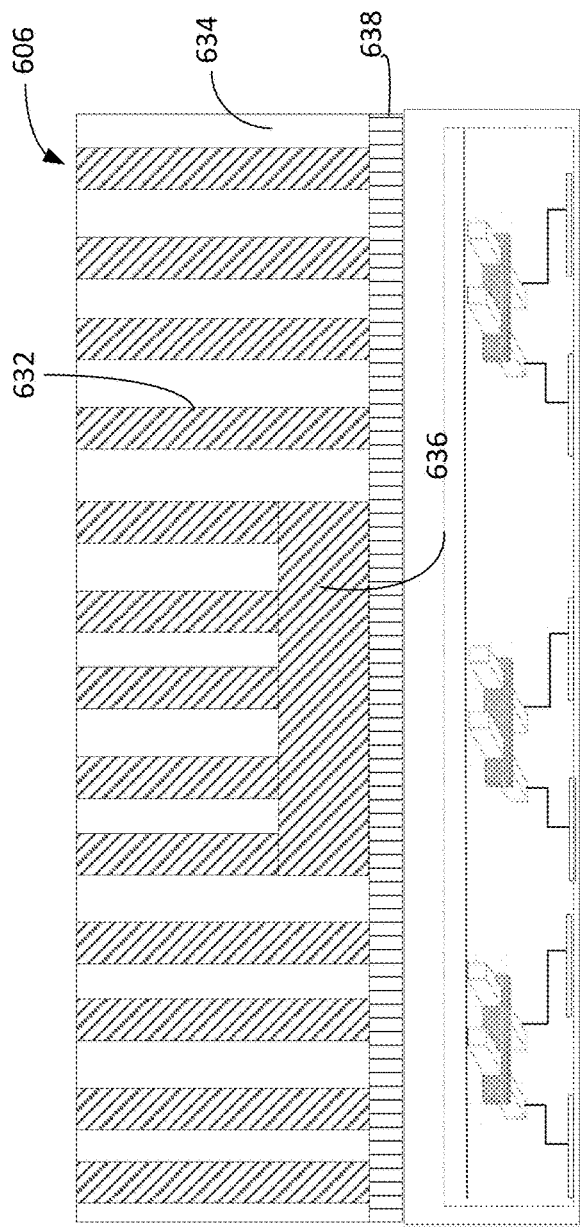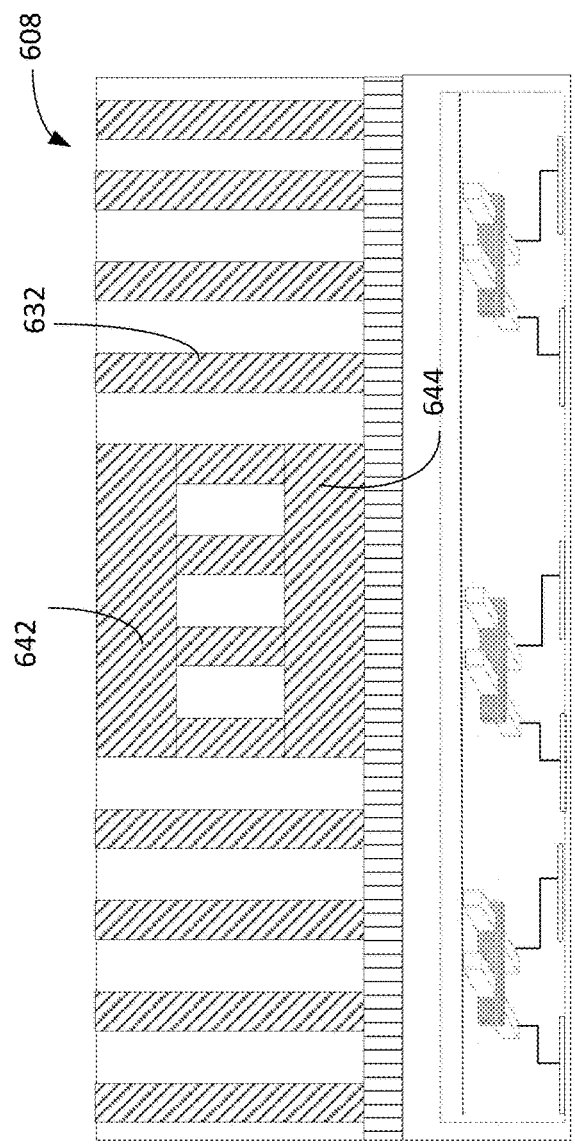
FIG. 6C
FIG. 6D

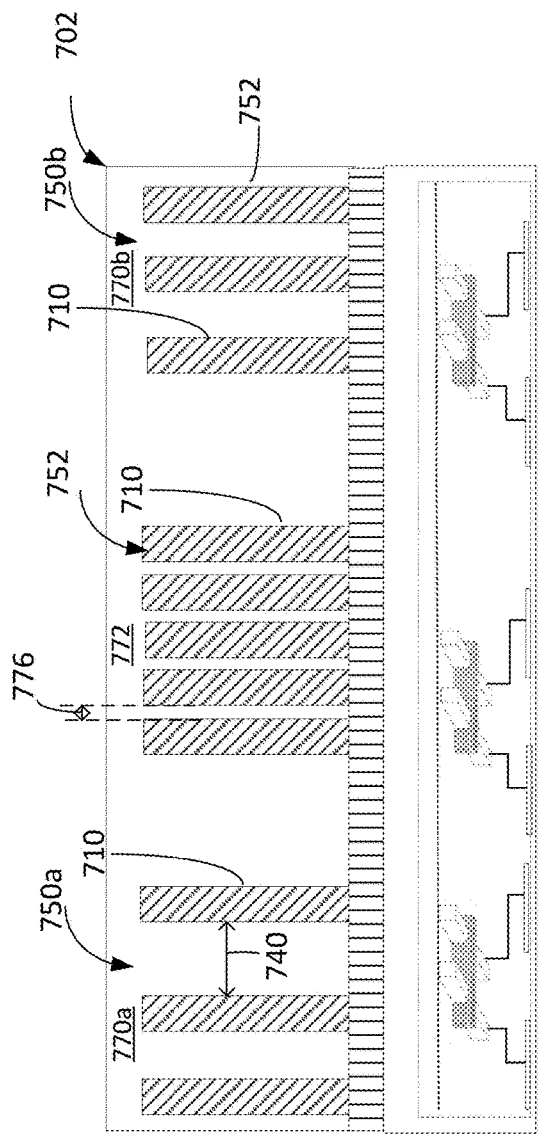
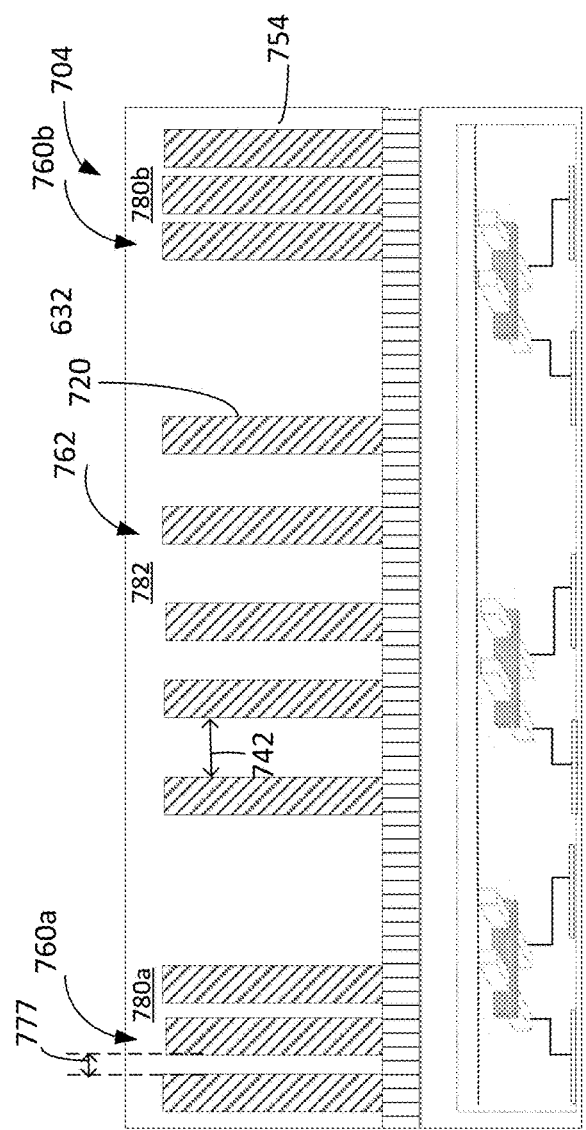
FIG. 7A
FIG. 7B

THREE DIMENSIONAL IC PACKAGE WITH THERMAL ENHANCEMENT

BACKGROUND

Electronic devices, such as tablets, computers, copiers, digital cameras, smart phones, control systems and automated teller machines, among others, often employ electronic components such as chip assemblies or integrated circuit (IC) dies that are connected by various interconnect components. The chip assemblies or IC dies may include memory, logic, devices, or other IC dies.

The demand for IC dies or chip assemblies for higher performance, higher capacity and lower cost has driven the demand for small sizes and more capable microelectronic components. Furthermore, the distribution and the distance among the IC dies also becomes denser and closer. Proper thermal management and cooling of the chip assemblies during operation has become increasing important.

However, due to the space constraints of the IC package, some chip assemblies may have lower cooling efficiency than others, resulting in overheating. Such overheating may result in device failure or electrical performance deterioration.

SUMMARY

The present disclosure relates to an IC die comprising a temperature control element. The temperature control element may be an integral part of the IC die that may assist temperature control of the IC die when in operation. When such IC die with temperature control element is assembled in an IC package, the thermal dissipation efficiency for the overall IC package is then enhanced. In one example, an integrated circuit (IC) die includes a substrate. A temperature control element is formed on a first side of the substrate. A plurality of device structures is formed on a second side of the substrate. The temperature control element is formed as an integral part of the IC die.

In one example, the first side is opposite to the second side. An activation layer is formed between the plurality of device structures and the temperature control element. In one example, the temperature control element includes a plurality of vias formed in a base structure. The vias are blind vias having an end embedded in the base structure. The vias are open vias having both ends formed at outer surfaces of the base structure. A heat dissipation material is disposed in the vias in the base structure. The heat dissipation material includes at least one of conductive materials, ceramic materials, metal-ceramic composite materials, metal alloy materials, semiconductor materials, graphite, diamond, or organic materials.

In one example, the plurality of vias includes a first group of the vias having a first pitch density formed in an edge portion of the base structure. A second group of the vias having a second pitch density different from the first pitch density formed in a center portion of the base structure. The base structure comprises silicon. The IC die is an application specific integrated circuit (ASIC).

Another aspect of the technology is directed to an integrated circuit (IC) package. The IC package includes an IC die disposed on a package substrate. The IC die has a temperature control element disposed on a first side of a substrate and a plurality of devices formed on a second side of the substrate. One or more memory stacks are formed on the package substrate adjacent to the IC die. A heat distribution device is disposed on the IC die.

In one example, the temperature control element has an upper surface facing the heat distribution device and a lower surface facing the first side of the substrate. The temperature control element includes a plurality of vias formed in a base structure. The temperature control element includes a heat dissipation material disposed in the vias in the base structure. The heat dissipation material comprises at least one of conductive materials, ceramic materials, metal-ceramic composite materials, metal alloy materials, semiconductor materials, graphite, diamond, or organic materials.

In one example, the plurality of vias includes a first group of the vias having a first pitch density formed in an edge portion of the base structure. A second group of the vias having a second pitch density different from the first pitch density is formed in a center portion of the base structure. The base structure comprises silicon.

Yet another aspect of the technology is directed to a method for manufacturing a temperature control element in an IC die. The method includes reducing a thickness from a first side of a substrate, wherein the substrate has the first side and a second side opposite to the first side, wherein the second side has a plurality of devices formed thereon and bonding a temperature control element on the first side of the substrate.

In one example, the temperature control element comprises a plurality of vias formed in a silicon base structure.

DESCRIPTION OF THE DRAWINGS

FIGS. 3A-3C depict cross-sectional views of an IC die for manufacturing a temperature control element therein at different manufacturing stages in accordance with aspects of the disclosure.

FIGS. 5A-5F depict cross-sectional views of an IC die when manufacturing a temperature control element therein at different manufacturing stages in accordance with aspects of the disclosure.

FIGS. 6A-6D depict cross-sectional views of different examples of temperature control elements in accordance with aspects of the disclosure.

FIGS. 7A-7B depict cross-sectional views of different examples of temperature control elements in accordance with aspects of the disclosure.

DETAILED DESCRIPTION

The technology relates generally to an IC die including a temperature control element. The temperature control element may be an integral part of an IC die that may assist temperature control of the IC die when in operation. In one example, the IC die may have a substrate having a first side coupled to the temperature control element and a second side including a plurality of devices, such as semiconductors transistors, devices, electrical components, circuits, or the like formed therein. The temperature control element may include a heat dissipation material disposed therein to assist dissipating thermal energy generated by the plurality of devices in the IC die during operation. The heat dissipation material disposed in the temperature control element may be distributed in a manner that can dissipate localized thermal energy generated by the plurality of devices when the devices are in operation. Thus, different configurations of the temperature control element may accommodate different device layouts with different thermal energy generation across the substrate in the IC die.

Figure 1:
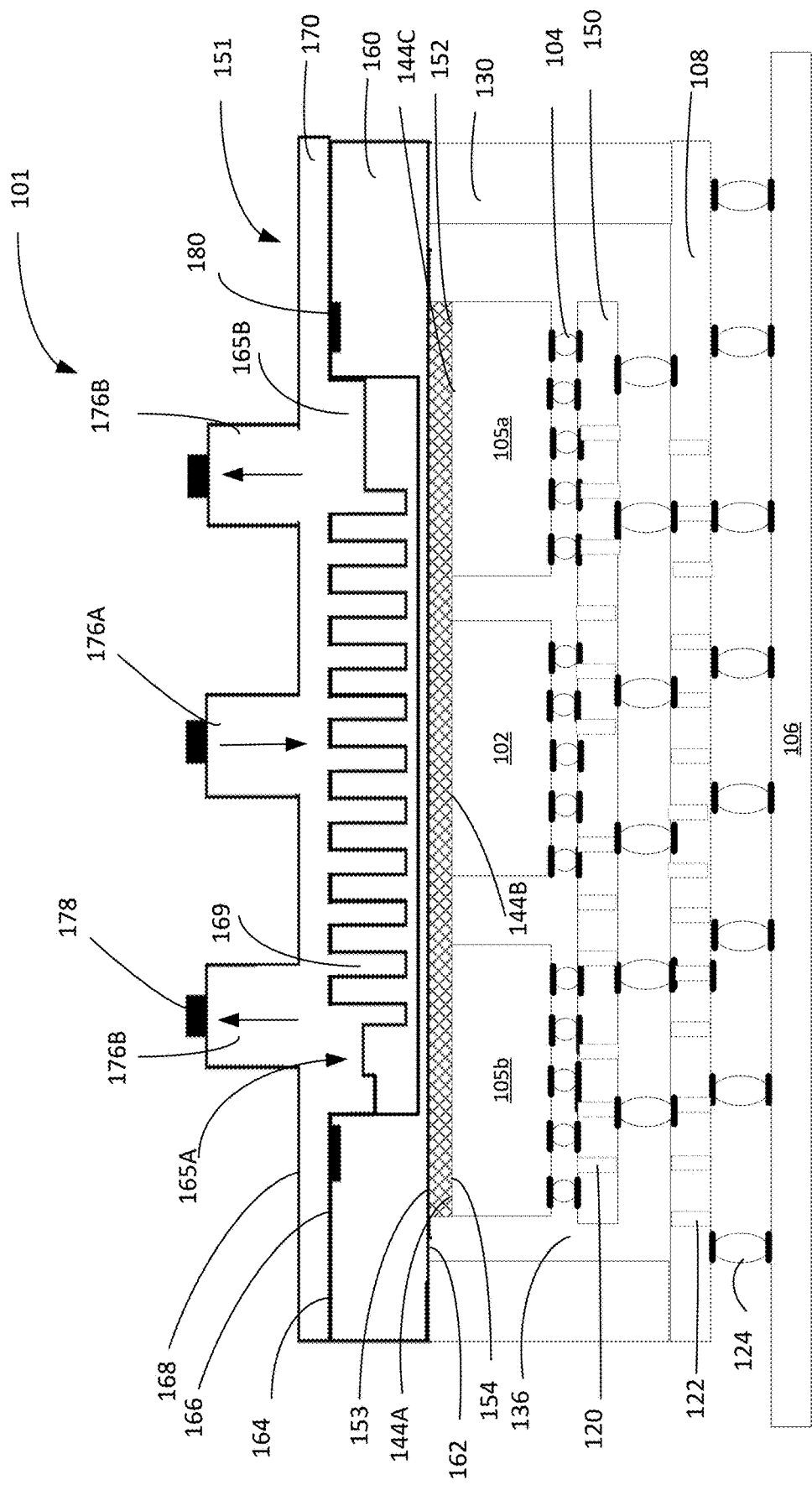
FIG. 1 depicts a cross-sectional view of an IC package in accordance with aspects of the disclosure.

FIG. 1 depicts a cross sectional-view of an IC package 101 including multiple chip assemblies formed on an interposer 150. For example, the IC package 101 may include at least one IC die 102, such as at least a core or main IC logic die. A plurality of memory devices chip assemblies 105a, 105b may be formed in close proximity to the IC die 102. In the example depicted in FIG. 1, two memory device chip assemblies 105a, 105b are shown and disposed in close proximity to one IC die 102. It is noted that the IC die and the devices chip assemblies disposed in the IC package 101 may be in any numbers. In one example, the IC die 102 utilized herein may be a graphics processing unit (GPU), custom application-specific integrated circuit (ASIC), or the like. The memory device chip assemblies 105a, 105b utilized herein may be high-bandwidth memory (HBM) components or any other type of memory or non-memory devices or stacks.

In one example, the IC die 102 and the memory device chip assemblies 105a, 105b are disposed on the interposer 150 through the plurality of connectors 104. The connectors 104 may be gold, nickel, tin, copper, solder, aluminum, tungsten or other suitable conductive materials. The IC die 102 and the memory devices chip assemblies 105a, 105b are electrically and/or physically connected through respective plurality of connectors (not shown) formed in the interposer 150.

The interposer 150 may have a plurality of through substrate vias (TSVs) 120 formed across a body of the interposer 150. The TSVs 120 may provide electrical connection channels to facilitate electrical connection of the IC dies 102 and the memory devices 105a, 105b to a package substrate 108 disposed thereunder. The interposer 150 and the package substrate 108 may assist integrating and stacking multiple dies, components, devices, chip assemblies and chiplets in a vertical three-dimensional (3D) fashion. Such arrangement may improve the packaging density.

In one example, the package substrate 108 may further have TSVs or interconnection channels 122 to facilitate connection of the package substrate 108 to a printed circuit board (PCB) 106, socket, or other such chip carrier, through a plurality of solder balls 124 arranged in a ball grid array (BGA). Other such arrangements and connectors may include contacts arranged in a land grid array (LGA), connector pins arranged in a pin grid array (PGA), etc.

The numbers and positions of the connectors 104, TSVs 120, 122, or solder balls 124 depicted in FIG. 1 are only for illustration and can be arranged in any manners or arrangement based on the device performance designs, layouts and considerations.

In some examples wherein the interposer 150 is not present, the IC die 102 and the memory devices 105a, 105b may be disposed on the package substrate 108 or printed circuit board (PCB) 106 directly.

A heat distribution device 151 overlies a thermal interface material (TIM) 152 in contact with the IC die 102 and the memory devices chip assemblies 105a, 105b or other chip assemblies, if available. In one example, the heat distribution device 151 may include a plate lid 170 disposed on a plate base 160. The plate base 160 may include a bottom surface 162 in direct contact with the TIM 152 and an opposed top surface 164 in contact with the plate lid 170. Similarly, the plate lid 170 may include a bottom surface 166 facing the top surface 164 of the plate base 160, and an opposed top surface 168 from which an inlet 176A and one or more outlets 176B may extend. In other examples, the number and configuration of inlets and outlets can vary, such as there being two outlets directly adjacent to one another. The plate base 160 and the plate lid 170 may be manufactured using molding, machining, or similar processes.

The plate base 160 may include a plurality of thermally conductive fins 169, which help to facilitate cooling of heat distribution device 151. A first recess 165A and a second recess 165B are formed around the plurality of thermally conductive fins 169. The fins 169 may be longitudinal structures protruding away from the top surface 168 of the plate lid 170. The fins 169 may be integrally formed with the plate base 160 or with the plate lid 170 or may be attached to the plate base 160 by soldering, adhesive or the like. In this example, the fins 166 are integrally formed with the plate base 160.

The plate lid 170 overlies the plate base 160, such that the bottom surface 166 of plate lid 170 is directly adjacent to the top surface 164 of plate base 160. Although not required, O-rings 180 may be provided within an edge portion of the plate base 160 so as to form a seal between plate base 160 and plate lid 170. When joined together, the plate base 160 and the plate lid 170 enable fluids and/or gases, such as coolants, to flow into the heat distribution device 151 through the inlet 176A, and out of the heat distribution device 151 through the outlets 176B. O-rings 180 may also be provided adjacent to the inlets 176A and the outlets 176B to provide a seal between the inlet 176A and the outlets 176B and the components which may be connected thereto.

The plate base 160 and the plate lid 170 may be formed from known heat dissipating materials, such as aluminum, copper, silver, metal alloys, etc. In the example depicted in FIG. 1, the plate base 160 and plate lid 170 are formed from the same or different materials.

A stiffener 130 extends between the heat distribution device 151 and the package substrate 108. In one example, the stiffener 130 may be in ring or circular shape. The ring or circular shape of the stiffener 130 defines a center aperture 136 configured to surround the IC die 102 and the memory device chip assemblies 105a, 105b. The stiffener 130 may be disposed between the package substrate 108 and the plate base 160 of the heat distribution device 151. An adhesive material (not shown) may be utilized at the interfaces between the package substrate 108 and the plate base 160 of the heat distribution device 151. In one example, the size and shape and position of the center aperture 136 may be adapted based on circuitry of the underlying package substrate 108 to be exposed through the center aperture 136 or the arrangement of the IC die 102 and the memory device chip assemblies 105a, 105b or the interposer 150 within the center aperture 136.

In one example, the stiffener 130 can be comprised of various materials. In one example, the stiffener 130 is formed from copper and is later plated with nickel (or similar metal) to promote adhesion to the package substrate 108.

In one example, the thermal interface material (TIM) 152 may be manufactured from a material having a high thermal conductivity. The TIM 152 may be a first surface 153 in direct contact with the bottom surface 162 of plate base 160. The TIM 152 has a second surface 154 opposite and parallel to the first surface 153. The second surface 154 of the TIM 152 is in direct contact with the rear surfaces 144A, 144B, 144C of the IC die 102 and the memory device chip assemblies 105a, 105b respectively. The TIM 152 may be a high thermal conductivity material as well as having a low melting temperature. Suitable examples of TIM 152 include metal or graphite, such as nano Ag or Indium, but other high thermal conductivity TIM materials may be implemented. Additionally, in some implementations, an ultra-high thermal conductivity or low thermal conductivity material may be utilized for the TIM 152.

The TIM 152 may be provided in any desired form, such as liquid, solid, semi-solid, and the like. For example, the TIM 152 may be applied in liquid form, which will later be cured to form a soft elastomer. In some examples, the TIM 152 can be a grease, film, or solder.

Figure 2A:
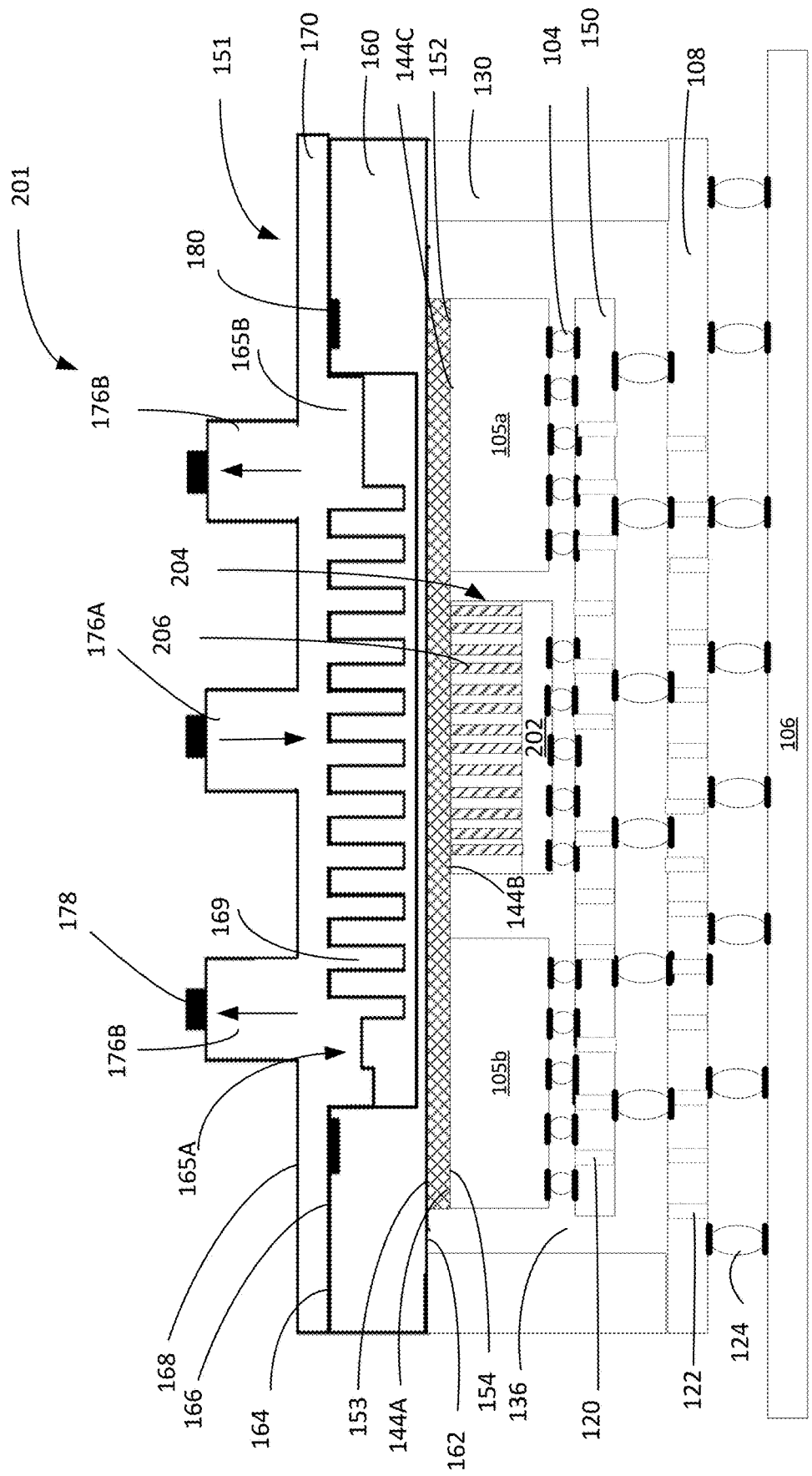
FIGS. 2A-2B depict cross-sectional views of an IC package having an IC die that includes a temperature control element in accordance with aspects of the disclosure.

FIG. 2A depicts a cross sectional view of an IC package 201 including an IC die 204, which includes a temperature control element 206, and the memory devices chip assemblies 105a, 105b. The structure of the IC package 201 is substantially similar to the IC package 101 depicted in FIG. 1 except that the configuration of the IC die 204 disposed in the IC package 201 may differ from the dies or chip assemblies disposed in the IC package 101. For example, the IC die 204 may include a temperature control element 206 formed therein in close proximity to the devices formed in the IC die 204. The IC die 204 is fabricated in a manner that includes the temperature control element 206 disposed therein. The temperature control element 206 may be disposed on a substrate 202 having a plurality of devices, such as semiconductor transistors, circuit or electric components, formed therein to perform the desired electrical functions and operations. The temperature control element 206 may include one or more heat dissipation materials formed therein to assist dissipating heat generated during operation. Details for the temperature control element 206 in the IC die 204 will be described below with reference to FIGS. 5A-5F, 6A-6D, 7A-7B and 8A-8B.

In one example, the IC die 204 and/or the memory devices chip assemblies 105a, 105b may be in direct contact to the TIM 152 to further couple to the heat distribution device 151 so that the heat generated from the IC die 204 and/or the memory device chip assemblies 105a, 105b may be properly dissipated with the assistance from the heat distribution device 151.

Figure 2B:
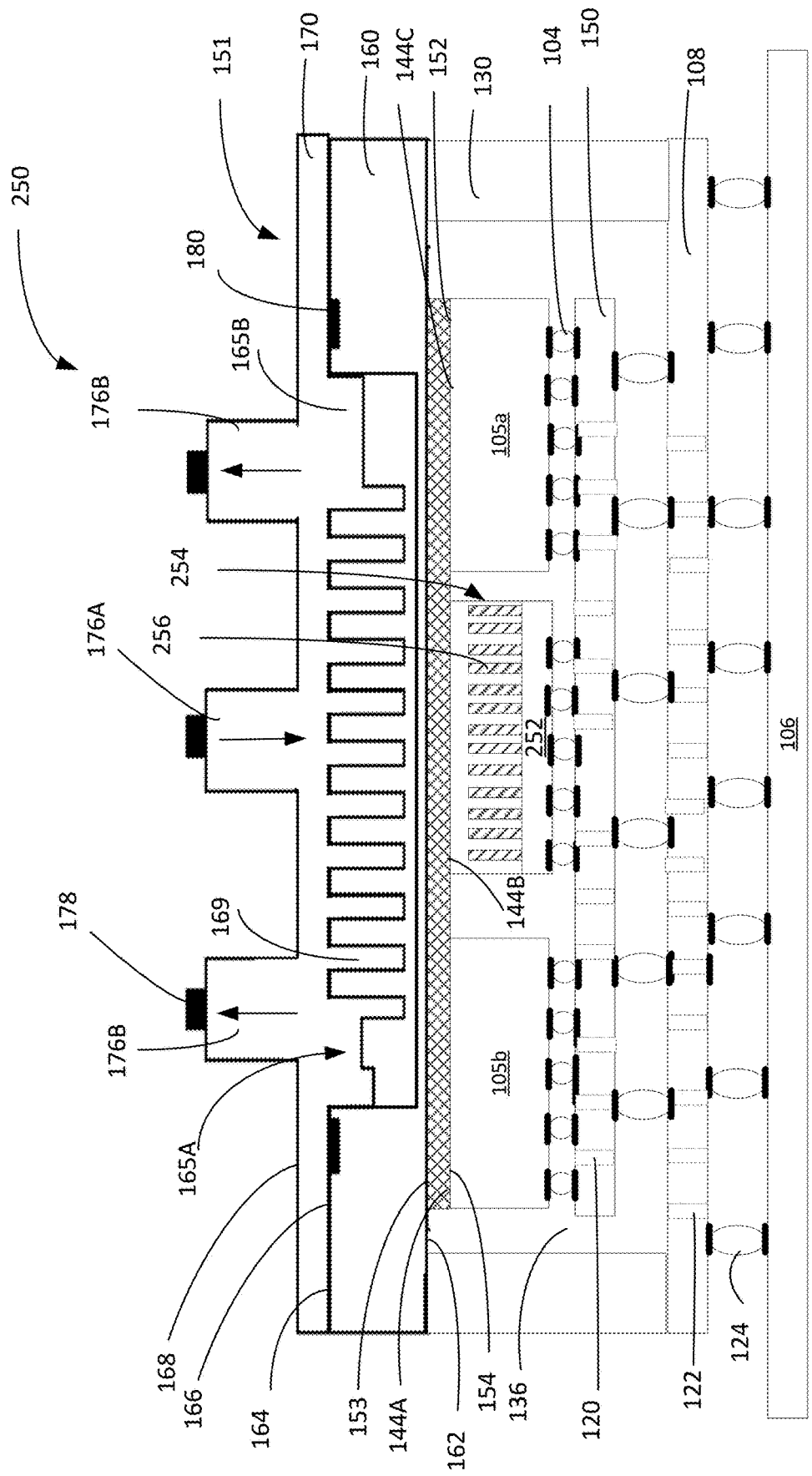

FIG. 2B depicts a cross sectional view of an integrated circuit (IC) package 250, including an IC die 254, which includes a temperature control element 256 and the memory devices chip assemblies 105a, 105b. The IC die 254 is fabricated in a manner that includes the temperature control element 256 disposed therein. The temperature control element 256 may be disposed on a substrate 252 having a plurality of devices, such as semiconductor transistors, circuits or electric components, formed therein to perform the desired electrical functions and operations. In one example, the temperature control element 256 may include one or more heat dissipation materials formed therein that have different configurations from the heat dissipation material configured in the temperature control element 206 depicted in FIG. 2A. It is noted that the configurations of the temperature control elements 256, 206 utilized in the disclosure herein may include several different examples, which will be described further below with reference to FIGS. 5A-5F, 6A-6D, 7A-7B and 8A-8B.

In one example, the IC die 254 and/or the memory devices chip assemblies 105a, 105b may be in direct contact to the TIM 152 to further couple to the heat distribution device 151. In this example, the heat generated from the IC die 254 and/or the memory devices chip assemblies 105a, 105b may be dissipated with the assistance from the heat distribution device 151. The fluids and/or gases, such as coolants, circulated into the heat distribution device 151 may assist dissipating away the thermal energy generated from the IC die 254 and/or the memory devices chip assemblies 105a, 105b during operation.

FIG. 3A-3C depicts an example for forming an IC die 300, such as the IC die 204, 254 depicted in FIG. 2A-2B, to include a temperature control element formed therein. In the example depicted in FIG. 3A, the IC die 300 includes a substrate 302, such as a semiconductor substrate, having a substrate body 305. The substrate 302 may include materials selected from at least one of crystalline silicon, such as Si<100> or Si<111>, silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass and sapphire. In some examples, the substrate 302 may include a SOI structure, or a buried dielectric layer disposed on a silicon crystalline substrate or the like.

In the embodiments depicted herein, the substrate 302 is a material containing silicon, such as crystalline silicon substrate. Moreover, the substrate 302 is not limited to any particular size, shape or materials. The substrate 302 may be a round/circular substrate having a 200 mm diameter, a 300 mm diameter or other diameters, such as 450 mm, among others. The substrate 302 may also be any polygonal, square, rectangular, curved or otherwise non-circular workpiece, such as a polygonal glass substrate as needed.

In one example, the substrate body 305 includes a first side 312 and a second side 314 opposite to and substantially parallel to the first side 312. A device region 304 is formed in and from the second side 314 of the substrate 302. In one example, the device region 304 may include a plurality of transistors, electric components, circuits or devices 306. The plurality of transistors, electric components, circuits or devices 306 may include a gate structure 307, such as a FINFET structure, gate wrapped-around structure, gate all around structure or the like, in connection with an interconnection wire structure 308 and/or other required elements or components to enable the semiconductor device operations and functions. The plurality of transistors, electric components, circuits or devices 306 may be formed on a base region 303 in the substrate body 305. The base region 303 may include other structures formed therein, such as shallow trench isolation (STI) structures with diffusion regions, such as active regions, formed therein and/or a fin structure formed around shallow trench isolation structure, such as a FINFET structure, gate wrapped-around structure, or gate all around structures, or any other suitable structures utilized in a semiconductor substrate.

As the transistors, electric components, circuits or devices 306 are formed on and from the second side 314 of the substrate 302, an unused portion 321 of the substrate body 305 under the base region 303 remains unprocessed without the transistors, electric components, circuits or devices 306 formed therein. Such unused portion 321 of the substrate body 305 may be a certain thickness to facilitate manufacturing of the transistors or devices 306 from the second side 314 of the substrate 302 during the transistor manufacturing process, such as allowing robot arms to grip the substrate for processing without breaking the substrate. Once the transistors, electric components, circuits or devices 306 are formed, the unused portion 321 of the substrate body 305 may be polished away or removed to a desired thickness range for certain process requirements, such as for the subsequent chip packaging process. In one example depicted herein, the unused portion 321 of the substrate body 305 may be removed, thinned or polished away to a certain thin thickness level to facilitate forming a temperature control element thereon. In one example, a thickness of the unused portion 321 removed from the substrate may be in a range between about 100 µm and about 500 µm.

To facilitate polishing away the thickness of the unused portion 321 of the substrate body 305, a sacrificial glue layer 330 may be formed on the second side 314 of the substrate 302, as shown in FIG. 3B. Subsequently, a sacrificial carrier 350 may then be formed on the sacrificial glue layer 330, as shown in FIG. 3C. The sacrificial carrier 350 may serve as a holding structure that allows a polishing head to carry the substrate 302 through the sacrificial carrier 350 during the backside polishing process without damaging the substrate 302. In one example, the sacrificial carrier 350 may be any suitable substrate that may be bonded to the substrate 302 and carry the substrate 302 during the backside polishing process.

Figure 4:
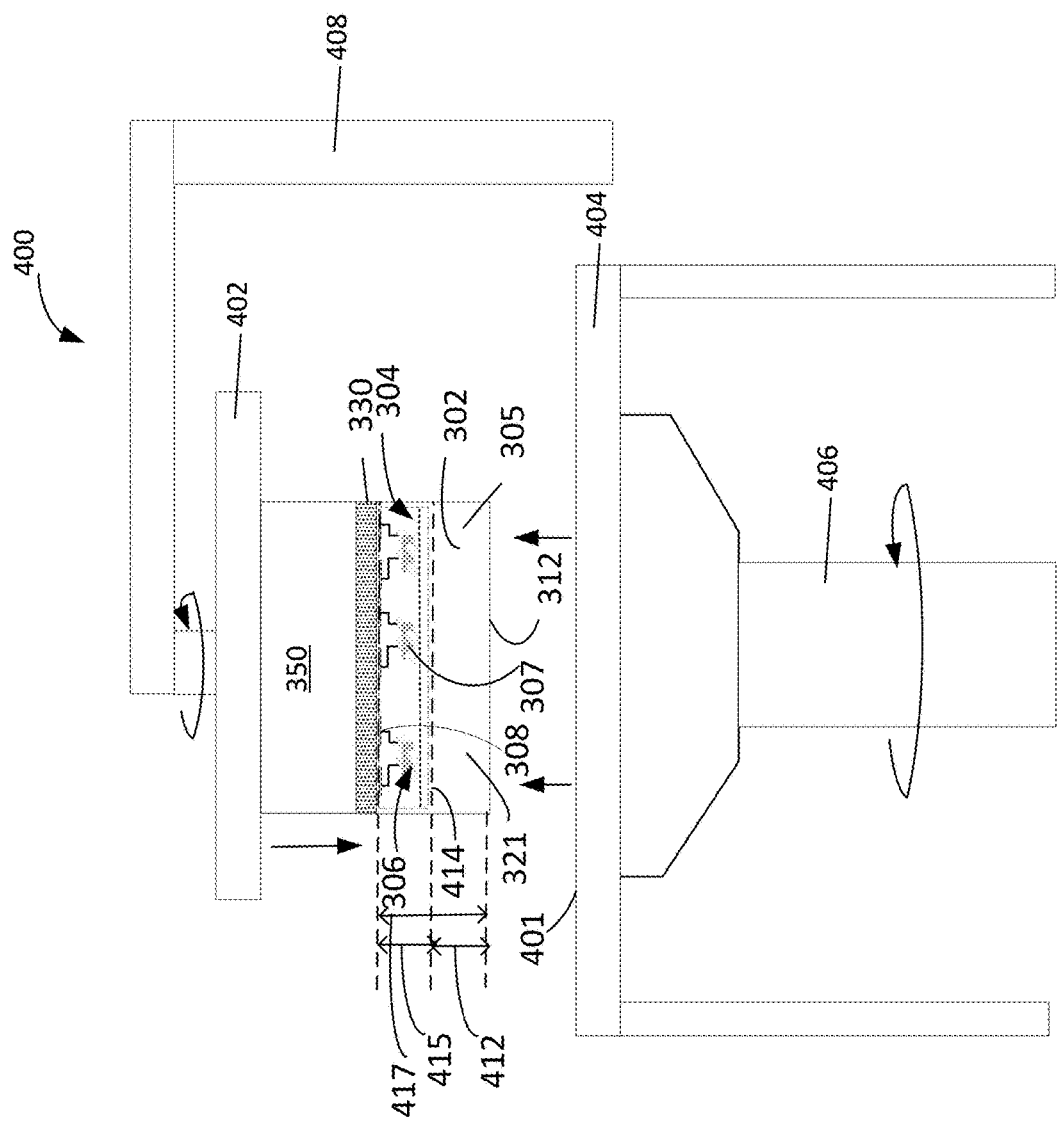
FIG. 4 depicts a cross-sectional view of a polishing tool that may be utilized to polish a thickness of a substrate of an IC die for manufacturing a temperature control element therein in accordance with aspects of the disclosure.

After the sacrificial carrier 350 is securely bonded to the substrate 302 through the sacrificial glue layer 330, the substrate 302 may be transferred into a polishing tool 400 for performing the backside polishing process, as shown in FIG. 4. The polishing tool 400, as depicted in FIG. 4. may be a chemical-mechanical polishing (CMP) tool, a single side grounding tool, or other suitable polishing tools. It is noted that the substrate 302 may be polished by any suitable polishing or material removal processes.

In one example, the polishing tool 400 includes a polishing head 402 configured to hold the sacrificial carrier 350, thus, facing the first side 312 of the substrate 302 toward a polishing pad 404 disposed opposite to the polishing head 402 in the polishing tool 400. The polishing pad 404 is positioned on a supporting pedestal 406, which may be actuated to rotate during the polishing process. Once the polishing head 402 secures the sacrificial carrier 350 in place, an actuator 408 in the polishing tool 400 may actuate the polishing head 402 to rotate while lowering down the polishing head 402 to push the first side 312 of the substrate 302 against a top surface 401 of the polishing pad 404 for polishing. The pressure generated at the interface between the first side 312 of the substrate 302 and top surface 401 of the polishing pad 404 facilitates mechanical polishing therebetween to remove the materials from the first side 312 of the substrate 302. The polishing pad 404 may also be rotated by the actuation from the supporting pedestal 406. During polishing, a chemical slurry may or may not be supplied to the polishing pad 404 to facilitate polishing the substrate 302, thinning the substrate body 305 until a predetermined thickness 415 of the substrate body 305 is reached. The polishing process polishes the substrate 302 from a total substrate thickness 417 to the predetermined thickness 415 with a selected removable thickness 412 configured to be removed from the substrate 302. The polishing process may start from polishing from the first side 312 of the substrate 302 until between about 100 µm and about 500 µm of the thickness 412 of the unused portion 321 of the substrate 302 is removed. For example, the polishing process may be continuously performed until the selected removable thickness 412 of the substrate 302 is removed from the substrate 302, forming an exposed surface 414 of the substrate 302. After a desired amount of the substrate 302 is removed, the polishing process may be terminated and the substrate 302 may be removed from the polishing tool 400.

FIG. 5A depicts the substrate 302 after the polishing process, forming the exposed surface 414 after the selected removable thickness 412 of the substrate 302 is removed from the substrate 302 so that the substrate 302 has a predetermined thickness 415. In one example, the predetermined thickness 415 of the substrate 302 that substantially includes the device region 304 is between about 200 µm and about 700 µm.

Subsequently, a surface treatment or activation process may be performed to form an activation layer 502 on the exposed surface 414 of the substrate 302. It is noted that the example depicted in FIG. 5B is rotated 180 degrees, as opposed to the example depicted in FIG. 5A, to have the exposed surface 414 facing up for ease of explanation.

In one example, the surface activation process may be a surface oxidation process, a thermal treatment process, a plasma treatment process, or other suitable process to activate and/or modify a surface property of the exposed surface 414 of the substrate 302. In one example, the surface activation process is performed by supplying an oxygen containing gas or an oxygen containing agent to the exposed surface 414 of the substrate 302. A thermal energy, a plasma energy, a laser energy or other types of energy may be applied when supplying the oxygen containing gas or the oxygen containing agent to the exposed surface 414 of the substrate 302. The energy may dissociate the oxygen containing gas or an oxygen containing agent as supplied to incorporate oxygen elements into the exposed surface 414 of the substrate 302, forming the activation layer 502 on the exposed surface 414 of the substrate 302.

After the activation layer 502 is formed on the exposed surface 414 of the substrate 302, a temperature control element 506 having a bonding layer 504 formed thereon, as shown in FIG. 5C, may be attached and/or bonded to the activation layer 502, as shown in FIG. 5D. The temperature control element 506 is bonded to the substrate 302 by a thermal bonding process. The thermal bonding process allows the bonding layer 504 from the temperature control element 506 to be adhered onto the activation layer 502 formed on the substrate 302. The bonding layer 504 and the activation layer 502 may be manufactured from similar materials, such as an oxygen containing material. Thus, after the bonding process, the bonding layer 504 and the activation layer 502 may become a unitary film in form of a single layer present at the interface between the substrate 302 and the temperature control element 506, as shown in FIGS. 5D, 5E and 5F. After the temperature control element 506 is attached to the substrate 302, a mechanical structure 508 may be utilized to debond or remove the sacrificial carrier 350 from the substrate 302, as shown in FIG. 5E. After the sacrificial carrier 350 is removed, along with the sacrificial glue layer 330 or using another manufacturing procedure, an IC die 550 having the temperature control element 506 disposed on the substrate 302 having the device region 304 formed therein is obtained, as shown in FIG. 5F. Thus, the resultant IC die 550 includes a first side having the temperature control element 506 formed therein while including a second side having the device region 304 configured to perform its electrical functions and purposes when in operation. In one example, the device region 304 of the IC die 550 is an ASIC having the temperature control element 506 formed in the IC die 550.

In one example, the activation layer 502 may also serve as a barrier layer so that the heat dissipating material from the temperature control element 506 is not in direct contact or in electrical communication with the devices or transistors located in the device region 304 in the substrate 302. Thus, the vias where the heat dissipating material is filled in the temperature control element 506 are not in contact with the devices or transistors located in the device region 304 in the substrate 302 so that the thermal energy dissipated therethrough would not be inadvertently reverted back to the devices or transistors located in the device region 304 in the substrate 302.

FIG. 6A-6D depicts different examples of temperature control elements 602, 604, 606, 608 disposed on a substrate, such as the substrate 302, having devices formed therein that may be utilized in an IC die, such as the IC die 204, 254, 550. In the example depicted in FIG. 6A, the temperature control element 602 may include a plurality of vias 612, such as through-substrate vias (TSV) formed in a base structure 614. In one example, the base structure 614 may be a silicon substrate, similar to the material utilized to manufacture the substrate 302. In the example depicted herein, the plurality of vias 612 is utilized for heat dissipation for three-dimensional vertical stacking in IC package structure. In one example, a heat dissipation material 618 is disposed in the vias 612. Other materials (not shown), such as a liner, a diffusion barrier layer or other suitable layers, may be utilized in the vias 612 surrounding or adjacent to the heat dissipation material 618 to facilitate interface management between the vias 612 and the base structure 614 as well as preventing the heat dissipation material 618 disposed in the vias 612 to be in direct contact with the base structure 614. In one example, the plurality of vias 612 is formed in and extended through the body of the base structure 614 by one or more etching processes. By adjusting process parameters of the one or more etching process, the depth of the vias 612 formed in the base structure 614 may be adjusted or varied. In the example depicted in FIG. 6A, the vias 612 are through vias, such as open vias, having a first end 613 exposed on a top surface 617 of the base structure 614 and a second end 615 exposed to a bottom surface 619 of the base structure 614. The second end 615 of the vias 612 may be sealed by a bonding layer 616 disposed on the bottom surface 619 of the base structure 614.

In one example, the vias 612 may have a width 611 (W) in a range from 0.01 µm to about 5 µm. In some embodiments, the vias 612 may have a depth 607 (D) in a range from 0.1 µm to about 15 µm. In some embodiments, the vias 612 may have an aspect ratio (D/W) in a range from 3 to about 20.

In one example, the heat dissipation material 618 that may be utilized to be disposed in the vias 612 may be conductive materials, ceramic materials or dielectric materials, metal-ceramic composite materials, metal alloy materials, semiconductor materials, graphite, diamond, or organic materials. Suitable examples of the conductive materials that may be utilized to form the heat dissipation material 618 may include copper (Cu), aluminum (Al), Sn, Au, Pb, Ag, Ni, Bi, combinations thereof and/or alloys thereof. Suitable examples of the ceramic or dielectric materials include a high dielectric constant, such as high-k, material, such as $HfO_2$, $Si_3N_4$, $Al_2O_3$, $ZnO_2$, or the like. $SiO_2$ may also be used for the heat dissipation material 618. In one example, the dissipation material 618 utilized herein is copper or a copper-containing material, or Au.

Figure 6A:
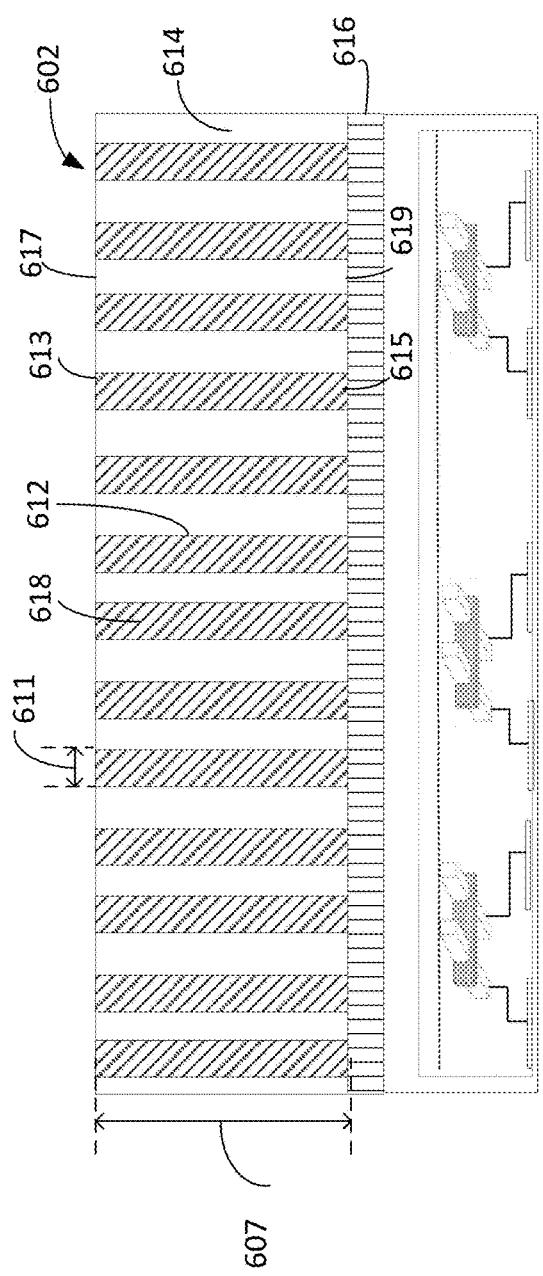
Figure 6B:
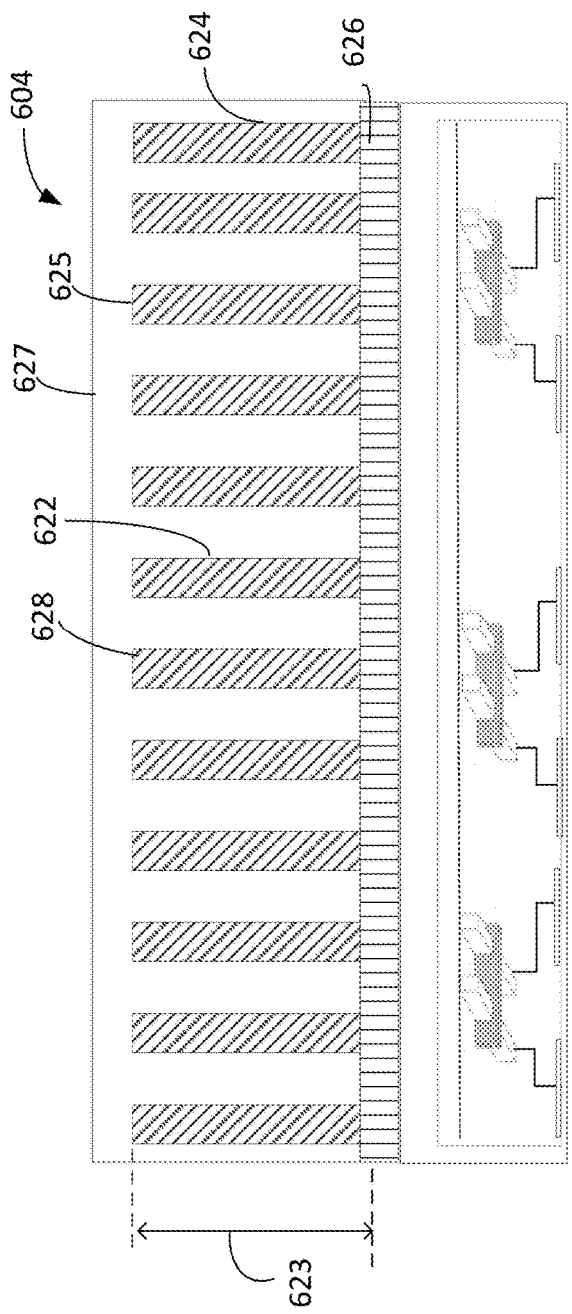

In the example depicted in FIG. 6B, the plurality of vias 622 formed in the base structure 624 are blind vias, where at least one end 625 of the vias 622 are embedded in the base structure 624 without openings formed on the top surface 627 of the base structure 624. The depth 623 of the blind vias 622 formed in the base structure 624 may be varied based on different process requirements. For example, when the efficiency requirement of the heat dissipation is not required to be overly high, the depth of the blind vias 622 may be controlled at a relatively short range. This may save manufacturing cost, such as reducing the via etching time as well as heat dissipation material filling time and cost.

In the example depicted in FIG. 6C, the temperature control element 606 may include a plurality of vias 632 formed in a base structure 634. A heat dissipation pad 636 may be formed substantially at a center portion of the base structure 634 close to the bonding layer 638. The heat dissipation pad 636 may provide a relatively large heat dissipation area, as opposed to the vias 632, to assist dissipating heat at certain local spot at a greater dissipation rate. For example, during operation, some areas with a relatively greater amount of transistors, gate structures or devices disposed therein often accumulate a greater amount of heat, as opposed to the areas where merely some metal interconnection pins or wires are formed. Thus, utilization of the heat dissipation pad 636 may assist dissipating the heat generated at certain local hot spots at a faster rate so as to efficiently carry away the heat from an IC die.

In another example depicted in FIG. 6D, an additional heat dissipation pad 642 may be formed on an upper portion of the temperature control element 608, along with a bottom heat dissipation pad 644 disposed therein. Similarly, the one or more heat dissipation pads 642, 644 may provide additional heat dissipating area to assist dissipating heat at certain local hot spots at a greater heat dissipating rate or efficiency.

FIG. 7A-7B depicts additional examples of temperature control elements 702, 704 formed in an IC die. The temperature control elements 702, 704 may include a plurality of vias 710, 720 with different pitch densities formed at different locations of the base structure 752, 754. In some examples, the plurality of vias 710, 720 formed across the base structures 752, 754 may have different pitch densities due to various reasons. For example, as the vias 710, 720 formed in the base structure 752, 754 are often configured to have high aspect ratios, reactive etchants supplied during the via etching process may not always be able to travel down or reach to the bottom of the vias 710, 720 to form the vias 710, 720 with the desired high aspect ratios. Thus, by arranging different pitch densities of the vias 710, 720 at different locations across the base structure 752, 754, the reactive etchants may be distributed across the base structures 752, 754 in a relatively more uniform way, or also to avoid micro-loading effect, so as to assist the reactive etchants to travel down through the vias 710, 720 to form the vias 710, 720 with the desired profiles and aspect ratios.

In the example depicted in FIG. 7A, a first group 750a, 750b of vias 710 located at an edge portion 770a, 770b of the base structure 752 may have a pinch density less than a pinch density of a second group 752 of the vias 710 located a center portion 772 of the base structure 752. For example, a pitch 740 between the vias 710 located at the edge portions 770a, 770b may be longer than a pitch 776 between the vias 710 located at the center portion 772 of the base structure 752. It is noted that when a pitch between the vias is relatively shorter, a higher pitch density is obtained. In contrast, when a pitch between the vias is relatively longer, a lower pitch density is obtained.

In the example depicted in FIG. 7B, in contrast, a first group 760a, 760b of vias 720 may have a pitch density greater than a pitch density of a second group 762 of the vias 720 located in the center portion 782 of the base structure 754. For example, a pitch 770 between the first group 760a, 760b of the vias 720 is smaller than a pitch 742 between the second group 762 of the vias 720 located in the center portion 782 of the base structure 754.

It is noted that the pitch density may be varied and distributed differently across different portions of the base structures based on heat dissipation efficiency and manufacturing cost and complexity considerations.

Figure 8A:
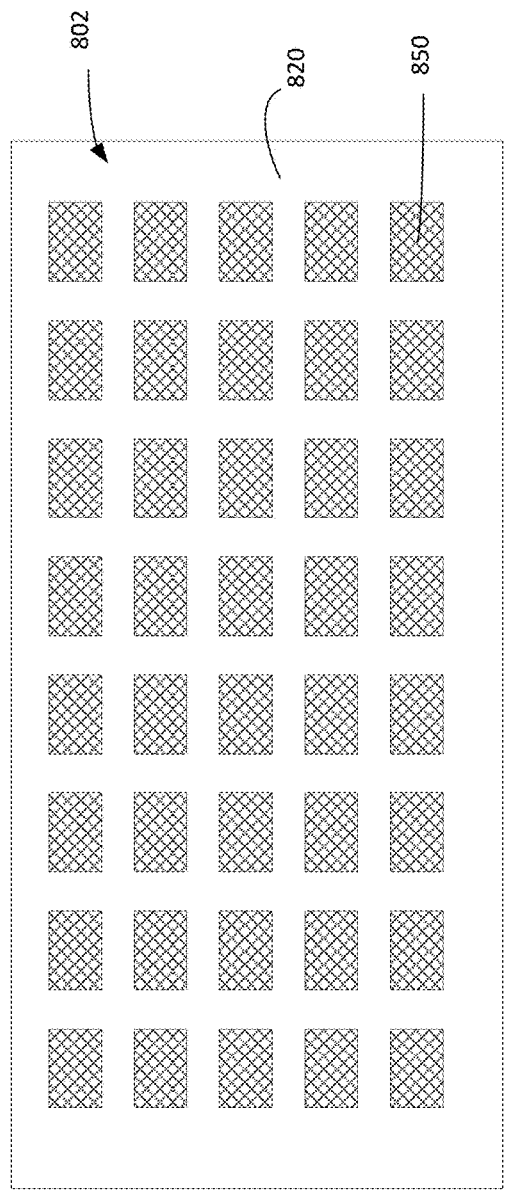
FIG. 8A-8B depict top views of different examples of temperature control elements in accordance with aspects of the disclosure.
Figure 8B:
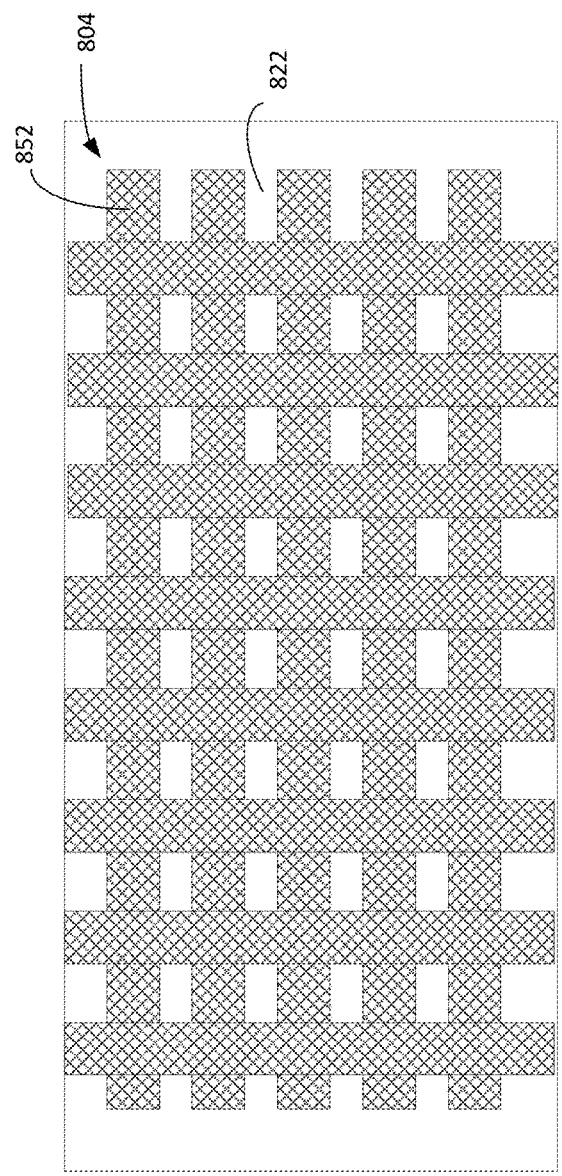

FIG. 8A-8B depict top views of different examples of the temperature control elements 802, 804 that have vias formed in different patterns. For example, in the example depicted in FIG. 8A, the vias 850 may be formed as vertical arrays having equal distance to each other in a base structure 820 without horizontal interception. In the example depicted in FIG. 8B, the vias 852 may be formed as both longitudinal vertical and horizontal bars across and orthogonal to each other. It is noted that the vias formed in the temperature control elements may be in any configurations to facilitate dissipating heat with a desired dissipation rate and efficiency.

Figure 9:
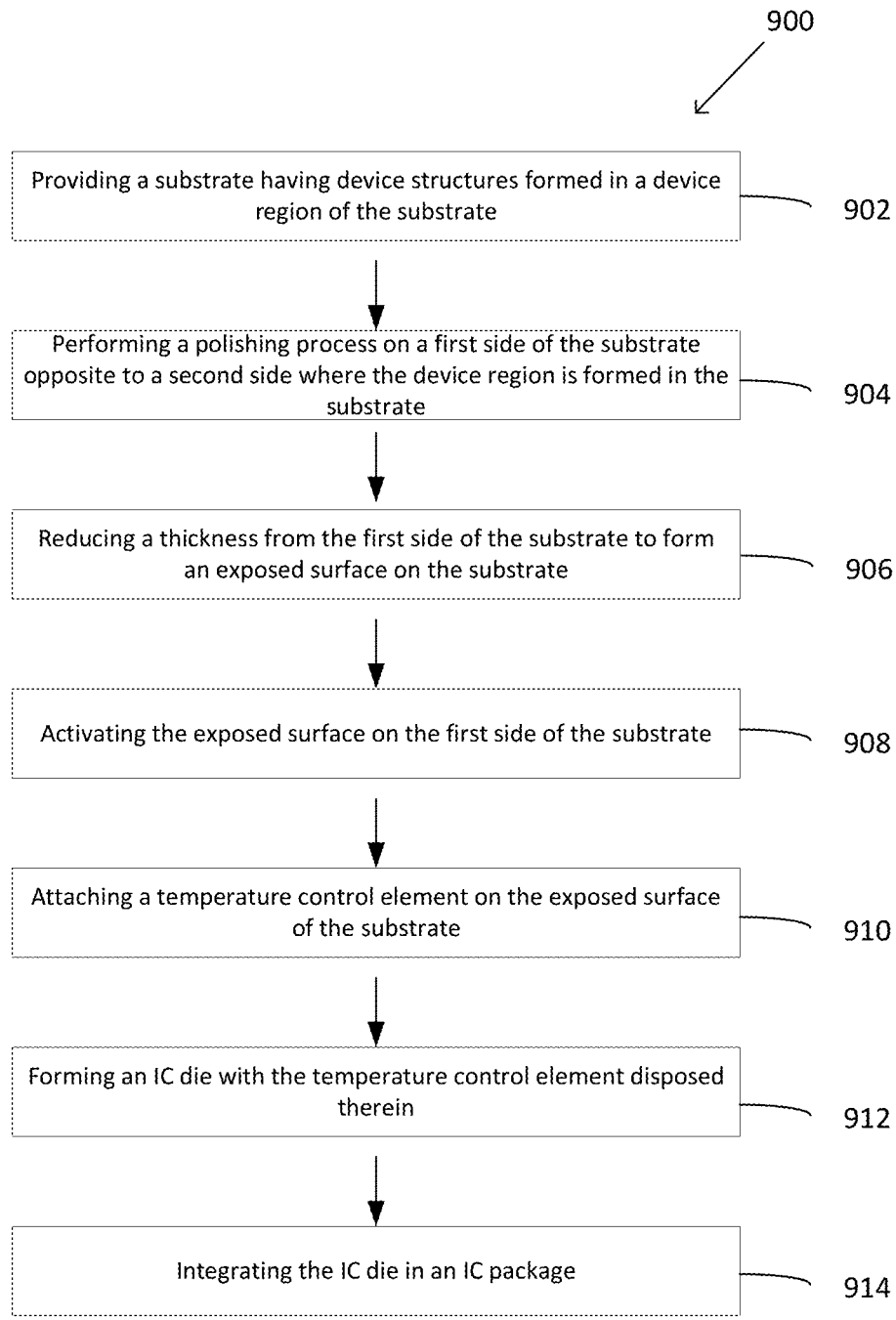
FIG. 9 depicts a flow diagram for manufacturing an IC package including an IC die including a temperature control element formed therein in accordance with aspects of the disclosure.

FIG. 9 depicts a flow diagram for manufacturing an IC package, such as the IC package 201, 250 depicted in FIG. 2A-2B including an IC die 204, 254 having the temperature control element 256, 206 formed therein in accordance with aspects of the disclosure. Such method may be performed using suitable manufacturing processes, including depositing, etching, lithography, polishing, soldering, or any suitable techniques. It should be understood that the operations involved in the following methods need not be performed in the precise order described. Rather, various operations may be handled in a different order or simultaneously, and operations may be added or omitted.

Referring to FIG. 9, in block 902, a substrate is provided having device structures, transistors, or other electronic components formed on a device region of the substrate.

In block 904, a polishing process is performed on a first side of the substrate opposite to a second side where the device region is formed in the substrate.

In block 906, a thickness of the substrate is reduced during the polishing process until a desired amount of the thickness of the substrate is removed from the substrate, forming an exposed surface on the first side of the substrate.

In block 908, a surface activation process may be performed to form an activation layer on the exposed surface of the substrate.

In block 910, subsequently, a temperature control element is formed on the activation layer to form an IC die with the temperature control element disposed therein.

In block 912, the IC die with the temperature control element disposed therein may be packed in an IC package under a heat distribution device.

The features described herein allow a temperature control element being formed as an integral part of an IC die that may have high heat dissipation efficiency during operation. The temperature control element may assist temperature control of the IC die when in operation. In one example, the IC die may have a substrate having a first side coupled to the temperature control element and a second side including a plurality of devices, such as semiconductors transistors, formed therein. The temperature control element may include a heat dissipation material disposed therein to assist dissipating thermal energy generated by the plurality of devices in the IC die during operation. Different patterns, features, and structures along with different selected materials for the heat dissipation material utilized in the temperature control element may provide an IC die with high efficiency of heat dissipation that is suitable for 3D IC package structures and requirements.

Although the technology herein has been described with reference to particular examples, it is to be understood that these examples are merely illustrative of the principles and applications of the present technology. It is therefore to be understood that numerous modifications may be made and that other arrangements may be devised without departing from the spirit and scope of the present technology as defined by the appended claims.

The invention claimed is:

1. An integrated circuit (IC) package, comprising:
an IC die disposed on a package substrate, wherein the IC die has a temperature control element disposed on a first side of a substrate and a plurality of devices formed on a second side of the substrate;
one or more memory stacks formed on the package substrate adjacent to the IC die;
a heat distribution device disposed on the IC die, the heat distribution device comprising a plate base and a plate lid disposed on the plate base.

2. The IC package of claim 1, wherein the first side is opposite to the second side.

3. The IC package of claim 1, comprising:
an activation layer formed between the plurality of device structures and the temperature control element.

4. The IC package of claim 3, wherein the base structure comprises silicon.

5. The IC package of claim 1, wherein the IC die is an application specific integrated circuit (ASIC).

6. The IC package of claim 1, wherein the temperature control element has an upper surface facing the heat distribution device and a lower surface facing the first side of the substrate.

7. The IC package of claim 1, wherein the temperature control element comprises a plurality of vias formed in a base structure.

8. The IC package of claim 7, wherein the vias are blind vias having an end embedded in the base structure.

9. The IC package of claim 7, wherein the vias are open vias having both ends formed at outer surfaces of the base structure.

10. The IC package of claim 7, wherein the temperature control element comprises a heat dissipation material disposed in the vias in the base structure.

11. The IC package of claim 10, wherein the heat dissipation material comprises at least one of conductive materials, ceramic materials, metal-ceramic composite materials, metal alloy materials, semiconductor materials, graphite, diamond, or organic materials.

12. The IC package of claim 7, wherein the plurality of vias comprises:
a first group of the vias having a first pitch density formed in an edge portion of the base structure; and
a second group of the vias having a second pitch density different from the first pitch density formed in a center portion of the base structure.

13. The IC package of claim 7, wherein the base structure comprises silicon.

14. The IC package of claim 1, further comprising a stiffener surrounding the IC die and the one or more memory stacks and extending between the heat distribution device and the package substrate.

15. The IC package of claim 1, wherein the plate base comprises a plurality of thermally conductive fins.

16. The IC package of claim 1, wherein the plate lid comprises an inlet and an outlet.

17. The IC package of claim 1, further comprising a thermal interface material (TIM) in contact with the IC die and the one or more memory stacks,
wherein the heat distribution device overlies the TIM.

* * * * *